(12) United States Patent
Jeng et al.

(10) Patent No.: US 6,200,828 B1
(45) Date of Patent: Mar. 13, 2001

(54) INTEGRATED CIRCUIT PACKAGE ARCHITECTURE WITH A VARIABLE DISPENSED COMPOUND AND METHOD OF MANUFACTURING THE SAME

(75) Inventors: Jacob Jeng, Hsinchu; Kun-Luh Chen, Chu-Nan Town; Edward Chen, Hsinchu, all of (TW)

(73) Assignee: AMIC Technology, Inc., Hsinchu (TW)

( * ) Notice: Subject to any disclaimer, the term of this patent is extended or adjusted under 35 U.S.C. 154(b) by 0 days.

(21) Appl. No.: 09/047,901

(22) Filed: Mar. 25, 1998

(30) Foreign Application Priority Data

Nov. 14, 1997 (TW) .................................................. 86116975

(51) Int. Cl.[7] ........................... H01L 21/44; H01L 21/48; H01L 21/50
(52) U.S. Cl. ......................... 438/106; 438/123; 438/127
(58) Field of Search .................................. 438/106, 123, 438/127

(56) References Cited

U.S. PATENT DOCUMENTS 5,200,367 * 4/1993 Ko .
5,893,723 * 4/1999 Yamanaka .
5,897,338 * 4/1999 Kaldenberg .
6,114,189 * 9/2000 Chia et al. .

OTHER PUBLICATIONS

Tummala, Rao et al., Microelectroni Packaging Handbook, Semiconductor Packaging, Part II, 2nd edition, Chapman & Hall, pp. 394–410 and 420, 1997.*

* cited by examiner

*Primary Examiner*—John F. Niebling
*Assistant Examiner*—Josetta Jones
(74) *Attorney, Agent, or Firm*—Christie, Parker & Hale, LLP

(57) ABSTRACT

An IC package architecture and a method of manufacturing the same are provided. By this packaging method, a molded compound is first formed, which covers the entire packaging area of the leadframe but leaving a window to expose the area where the chip is to be mounted. After the chip is mounted and wire bonded, a dispensed compound is formed the window to enclose the chip therein. The dispensing material can be variably selected by the manufacturer in accordance with actual application requirements. For instance, the dispensing material can be either a transparent material to allow the enclosed chip to be transparent to the outside, or a colored material for some prespecified identification purpose of the IC package. Moreover, the packaging method can be utilized on current types of IC packages and can be realized by using existing equipment and processes in a cost-effective manner without having to invest on new additional ones.

4 Claims, 3 Drawing Sheets

INTEGRATED CIRCUIT PACKAGE ARCHITECTURE WITH A VARIABLE DISPENSED COMPOUND AND METHOD OF MANUFACTURING THE SAME

CROSS-REFERENCE TO RELATED APPLICATION

This application claims the priority benefit of Taiwan application serial no. 86116975, filed Nov. 14, 1997, the full disclosure of which is incorporated herein by reference.

BACKGROUND OF THE INVENTION

1. Field of the Invention

This invention relates to integrated circuit (IC) manufacture technologies, and more particularly, to a new IC package architecture with a variable dispensed compound and a method of manufacturing the same. With this IC package architecture, the dispensed compound can be formed from a suitably selected material by the manufacturer in accordance with actual application requirements.

2. Description of Related Art

Integrated circuits are widely used in computers and intelligent electronic devices. Since IC chips are very small in size, they are usually supplied in packages for easy handling and utilization. The manufacture of ICs involves very complicated processes which can involve several hundreds of steps and needs several months to complete. The semiconductor industry is composed of four major branches: IC design, wafer fabrication, wafer testing, and packaging, each being a highly specialized field which requires state-of-the-art technologies and large amounts of capitals to accomplish.

The manufacture of an IC package includes three essential steps: preparing a wafer, forming a predesigned circuit on the wafer, and finally packing each die (chip) cutting apart from the wafer in a package. The packaging process is the final stage in the IC manufacture.

Conventional packaging methods, however, only involve one single molding process to form a molded compound for enclosing the chip therein. In some IC products where the enclosed chips should be transparent to the outside, such as EPROM (erasable programmable read-only memory) and EEPROM (electrically erasable programmable read-only memory), the molding is performed by using relatively expensive materials, such as ceramic, to form the compound. The manufacturing cost is therefore very high. Moreover, the conventional packaging methods will not allow the compound to be variably formed with a selected color for identification purpose of the integrated circuit.

FIGS. 1A–1C are schematic sectional diagrams used to depict the architecture of a conventional IC package and the steps involved in the method for manufacturing this IC package.

Referring first to FIG. 1A, the IC package is to be constructed on a leadframe 10 which is formed with two major parts: a die pad 16 in the center and a number of package pins 22 on the periphery of the die pad 16. In the packaging process, the first step is to perform a die-attach process so as to mount a chip 20 (which is a die cut apart from a fabricated wafer) on the front side of the die pad 16.

Referring next to FIG. 1B, in the subsequent step, a wire-bonding process is performed so as to connect the bonding pads (not shown) on the chip 20 respectively via a plurality of wires 24 to the corresponding ones of the package pins 22.

Referring further to FIG. 1C, in the subsequent step, a molding process is performed so as to form a molded compound 26 which hermetically encloses the chip 20, the die pad 16, and the wires 24 therein, with only the outer end of the package pins 22 being exposed to the outside.

In the case of the foregoing IC package being used to enclose an ordinary chip other than EPROM or EEPROM, the molded compound 26 can be formed from a lowcost material, such as plastics. However, in the case of the foregoing IC package being used to enclose an EPROM chip or an EEPROM chip therein, the molded compound 26 should be formed with a transparent window that can allow ultraviolet light to pass therethrough during a reprogramming process to erase old data from the chip and program new data into the same. To provide the transparent window, a special (and relatively costly) material, such as ceramics, is used to form the molded compound 26. The high manufacturing cost of these IC packages make them considerably more expensive on the market.

SUMMARY OF THE INVENTION

It is therefore an objective of the present invention to provide an IC package architecture and a method of manufacturing the same, which are useful for forming a transparent window in such IC products as EPROM and EEPROM with a considerably reduced manufacturing cost.

It is another an objective of the present invention to provide an IC package architecture and a method of manufacturing the same, which allow the manufacturer to form a variable dispensed compound to enclose the chip from a suitably selected material that can variably selected to be either a transparent material so as to allow the enclosed chip to be transparent to the outside, or a colored material for some prespecified identification purpose of the IC package.

It is still another objective of the present invention to provide an IC package architecture and a method of manufacturing the same, which have the above-mentioned benefits while nonetheless can be utilized on current types of IC packages and can be realized by using existing equipment and processes in a cost-effective manner without having to invest on new additional ones.

In accordance with the foregoing and other objectives of the present invention, a new IC package architecture and a method of manufacturing the same are provided.

The method of the invention includes the following steps:

(1) preparing a leadframe which includes a die pad and a number of package pins;

(2) performing a molding process with a molding material so as to form a molded compound which covers the entire packaging area on a first side of the leadframe, but only covers a peripheral part of the packaging area on a second side of the leadframe with a window to expose the bonding area on the second side of the leadframe;

(3) performing a die-attach process so as to mount a chip on the die pad on the second side of the leadframe;

(4) performing a wire-bonding process so as to electrically connect the chip to corresponding ones of the package pins; and (5) performing a dispensing process with a dispensing material so as to fill the dispensing material into the window to thereby form a dispensed compound in the window to enclose the chip therein.

In another aspect, the IC package architecture of the invention includes the following constituent elements:

(a) a leadframe which includes a die pad and a number of package pins;

(b) a molded compound which covers the entire packaging area on a first side of said leadframe, but only covers a peripheral part of the packaging area on a second side of said leadframe with a window to expose the bonding area on the second side of said leadframe;

(c) a chip mounted on said die pad on the second side of said leadframe;

(d) a plurality of wires which electrically connect said chip to corresponding ones of said package pins; and (e) a dispensed compound formed in said window on the second side of said leadframe to enclose said chip therein.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1A:
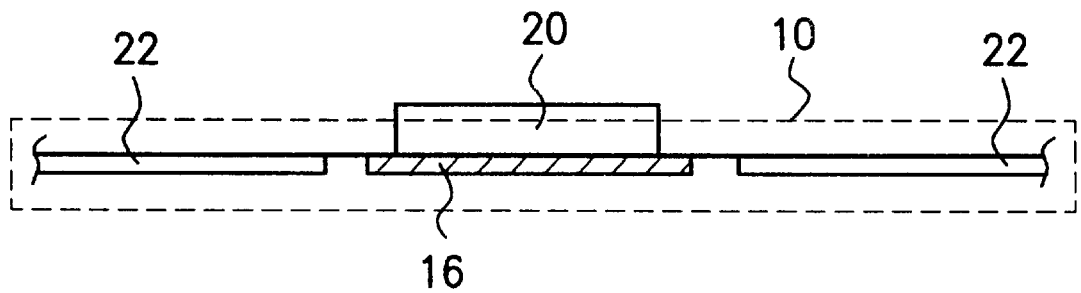
FIGS. 1A–1C are schematic sectional diagrams used to depict the architecture of a conventional IC package and the steps involved in the conventional method for manufacturing this IC package.
Figure 1B:
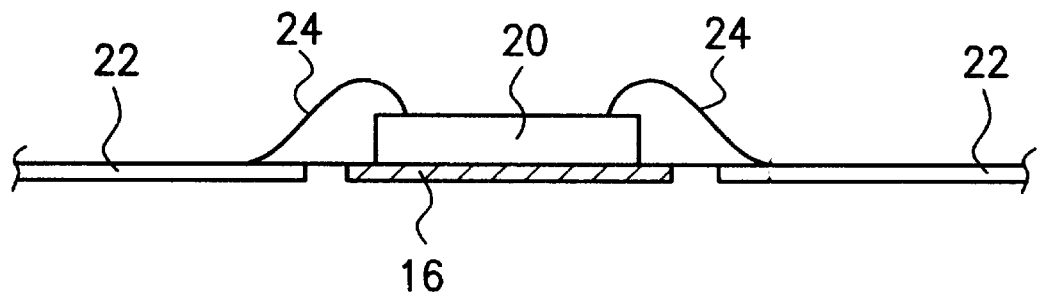
Figure 1C:
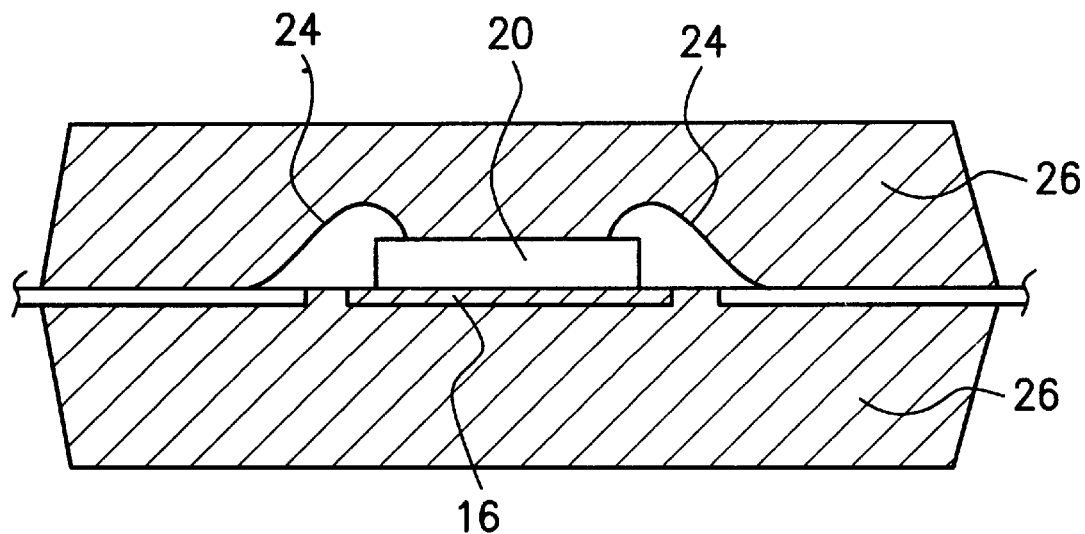

FIGS. 2A–2D are schematic sectional diagrams used to depict the IC package architecture according to the invention and the method for manufacturing the same. In these drawings, identical elements as those shown in FIGS. 1A–1C are labeled with the same reference numerals.

Figure 2A:
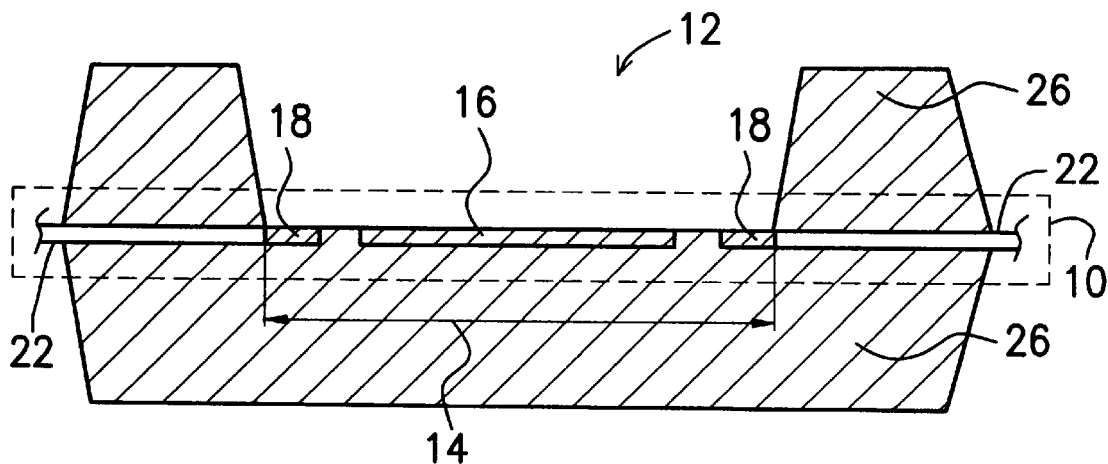
FIGS. 2A–2D are schematic sectional diagrams used to depict the IC package architecture according to the invention and the method for manufacturing the same.

Referring first to FIG. 2A, the IC package is to be constructed on a leadframe 10 which is formed with two major parts: a die pad 16 in the center and a number of package pins 22 on the periphery of the die pad 16.

Prior to the mounting of the chip on the leadframe 10, a molding process is first performed so as to form a molded compound 26 in such a manner that the molded compound 26 covers the entire packaging area on the back side of the leadframe 10, but covers only a peripheral part of the packaging are on the front side of the leadframe 10, leaving a window 12 to expose the bonding area 14 (including the front side of the die pad 16 and a plurality of bonding lead tips 18 which are the inner ends of the package pins 22 that are exposed in the bonding area 14.

Figure 2B:
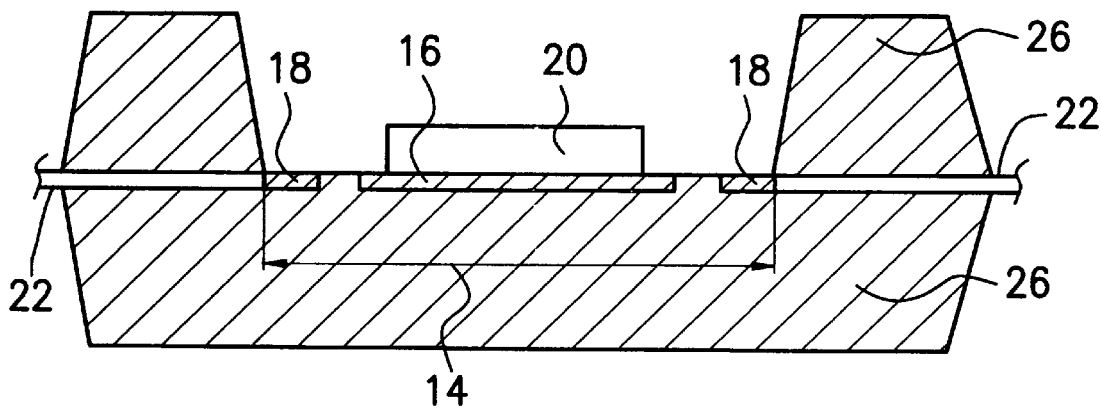

Referring next to FIG. 2B, in the subsequent step, a die-attach process is performed so as to mount a chip 20 (which is a die cut apart through a die-saw process from a fabricated wafer) through the window 12 onto the die pad 16.

Figure 2C:
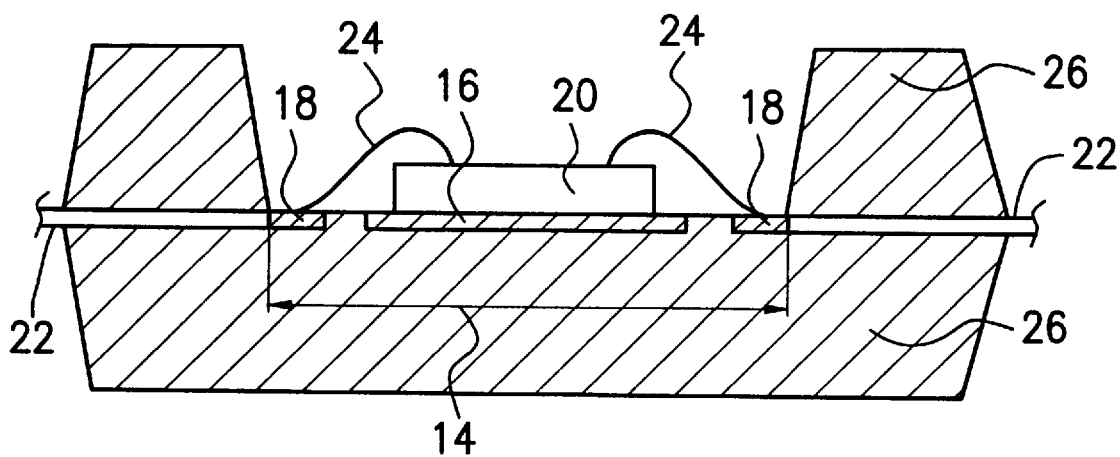

Referring further to FIG. 2C, the next step is to perform a wire-bonding process so as to connect the bonding pads (not shown) on the chip 20 respectively via a plurality of wires 24 to the corresponding bonding lead tips 18 in the bonding area 14.

Figure 2D:
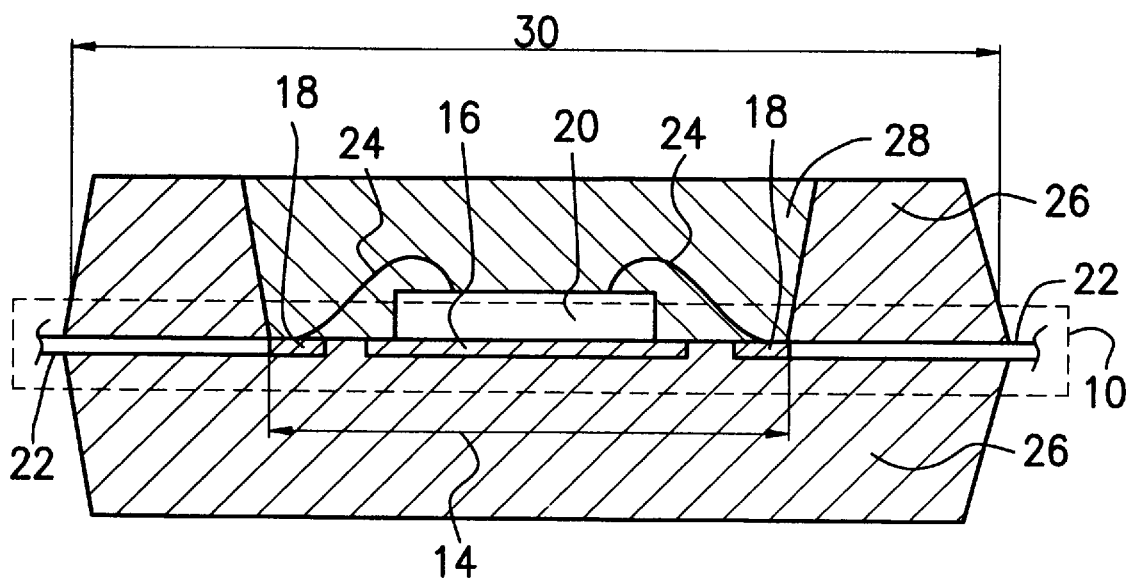

Referring next to FIG. 2D, in the subsequent step, a dispensing process is performed so as to fill a suitably selected dispensing material into the window 12 to thereby form a dispensed compound 28 to enclose the chip 20 therein. This completes the manufacture of the IC package in accordance with the method of the invention.

In conclusion, the IC package architecture of the invention includes one chip 20 mounted on the front side of the die pad 16, which is connected via the wires 24 to the bonding lead tips 18 of the package pins 22 in the bonding area 14; and the packaging area 30 of the leadframe 10 is enclosed by two compounds, i.e., the molded compound 26 and the dispensed compound 28, with the dispensed compound 28 being used to enclose the chip 20 therein, allowing only the outer ends of the package pins 22 to be exposed to the outside of the molded compound 26.

In the dispensing process, the dispensing material used to form the dispensed compound 28 can be selected from various materials in accordance with actual application requirements. For instance, the dispensing material can be a transparent material, such as glass, so as to allow the enclosed chip to be transparent to the outside so that ultraviolet light can pass therethrough onto the enclosed chip; or a colored material so that the IC package can be formed with a permanent colored part for identification purpose of the integrated circuit; or a ceramic material so that the IC package can withstand high temperature operating conditions. Further, the dispensing material can be the commonly used, low-cost resin or plastics if any of the foregoing and other special provisions are not required. The dispensing material used in the dispensing process can be different from or the same as the molding material used in the molding process. Moreover, in accordance with actual requirements, the surface of the dispensed compound 28 can be either designed to be leveled with or higher (protruded) or lower (recessed) in surface than the surrounding part of the molded compound 26 formed on the front side of the leadframe.

Today's ICs have advanced to low-power type that needs just a low-level current to drive, thus generating less heat that needs to be dissipated. Therefore, plastics and resins are suitable for use to enclose the chip in the package. In accordance with the invention, the molding material can be a low-cost material, such as plastics or resins, to form the molded compound; then in the dispensing process, the dispensing material can be selected in accordance with actual requirements from the above-mentioned materials, as a transparent material or a colored material, which is usually more expensive than plastics and resin. This allows the manufacture of the IC package to be more cost-effective.

Moreover, the method of the invention can be realized by using existing packaging equipment and processes without having to invest on and install new additional ones. It is also suitable for use on various existing types of IC packages with any numbers of pins. The invention can thus be realized in a very cost-effective manner.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for manufacturing an IC package, comprising the step of:

(1) preparing a leadframe which includes a die pad and a number of package pins;

(2) performing a moldings process with a molding material so as to form a molded compound which covers the entire packaging area on a first side of the leadframe, but only covers a peripheral part of the packaging area on a second side of the leadframe with a window to expose the bonding area on the second side of the leadframe;

(3) performing a die-attach process so as to mount a chip on the die pad on the second side of the leadframe;

(4) performing a wire-bonding process so as to electrically connect the chip to corresponding ones of the package pins; and (5) performing a dispensing process with a selected dispensing material so as to fill the dispensing material into the window to thereby form a dispensed compound in the window to enclose the chip therein, wherein the dispensing material includes ceramics.

2. A method for manufacturing an IC package, comprising the step of:

(1) preparing a leadframe which includes a die pad and a number of package pins;

(2) performing a molding process with a molding material so as to form a molded compound which covers the entire packaging area on a first side of the leadframe, but only covers a peripheral part of the packaging area on a second side of the leadframe with a window to expose the bonding area on the second side of the leadframe;

(3) performing a die-attach process so as to mount a chip on the die pad on the second side of the leadframe;

(4) performing a wire-bonding process so as to electrically connect the chip to corresponding ones of the package pins; and (5) performing a dispensing process with a selected dispensing material so as to fill the dispensing material into the window to thereby form a dispensed compound in the window to enclose the chip therein, wherein the dispensing material includes glass.

3. A method for manufacturing an IC package, comprising the step of:

(1) preparing a leadframe which includes a die pad and a number of package pins;

(2) performing a molding process with a molding material so as to form a molded compound which covers the entire packaging area on a first side of the leadframe, but only covers a peripheral part of the packaging area on a second side of the leadframe with a window to expose the bonding area on the second side of the leadframe;

(3) performing a die-attach process so as to mount a chip on the die pad on the second side of the leadframe;

(4) performing a wire-bonding process so as to electrically connect the chip to corresponding ones of the package pins; and (5) performing a dispensing process with a selected dispensing material so as to fill the dispensing material into the window to thereby form a dispensed compound in the window to enclose the chip therein, wherein the dispensed compound is protruded with respect to the surrounding part of the molded compound on the second side of the leadframe.

4. A method for manufacturing an IC package, comprising the step of:

(1) preparing a leadframe which includes a die pad and a number of package pins;

(2) performing a molding process with a molding material so as to form a molded compound which covers the entire packaging area on a first side of the leadframe, but only covers a peripheral part of the packaging area on a second side of the leadframe with a window to expose the bonding area on the second side of the leadframe;

(3) performing a die-attach process so as to mount a chip on the die pad on the second side of the leadframe;

(4) performing a wire-bonding process so as to electrically connect the chip to corresponding ones of the package pins; and (5) performing a dispensing process with a selected dispensing material so as to fill the dispensing material into the window to thereby form a dispensed compound in the window to enclose the chip therein, wherein the dispensed compound is recessed with respect to the surrounding part of the molded compound on the second side of the leadframe.

* * * * *